United States Patent
Chen et al.

(10) Patent No.: US 12,224,038 B2
(45) Date of Patent: Feb. 11, 2025

(54) MEMORY DEVICE AND INTELLIGENT OPERATION METHOD THEREOF

(71) Applicant: MACRONIX INTERNATIONAL CO., LTD., Hsinchu (TW)

(72) Inventors: Kuan-Chih Chen, New Taipei (TW); Chia-Hong Lee, Taoyuan (TW); Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 175 days.

(21) Appl. No.: 18/191,903

(22) Filed: Mar. 29, 2023

(65) Prior Publication Data

US 2024/0331747 A1    Oct. 3, 2024

(51) Int. Cl.
*G11C 11/409* (2006.01)
*G11C 7/10* (2006.01)
*G11C 11/54* (2006.01)

(52) U.S. Cl.
CPC ............ *G11C 7/109* (2013.01); *G11C 7/1012* (2013.01); *G11C 11/54* (2013.01)

(58) Field of Classification Search
CPC .................................................. G11C 11/409
See application file for complete search history.

(56) References Cited

U.S. PATENT DOCUMENTS

| | | | |
|---|---|---|---|
| 10,802,728 B2 | 10/2020 | Lee et al. | |
| 10,928,870 B2 | 2/2021 | Chang | |
| 11,334,260 B2 | 5/2022 | Roberts | |
| 11,386,972 B2 | 7/2022 | Li et al. | |
| 2021/0141540 A1 | 5/2021 | Gervais | |
| 2021/0280232 A1* | 9/2021 | Troia | G11C 11/54 |

FOREIGN PATENT DOCUMENTS

| | | |
|---|---|---|
| CN | 110543280 A | 12/2019 |
| CN | 111009280 A | 4/2020 |
| CN | 114373488 A | 4/2022 |
| TW | 1777366 B | 9/2022 |

* cited by examiner

*Primary Examiner* — Jason Lappas
(74) *Attorney, Agent, or Firm* — McClure, Qualey & Rodack, LLP

(57) ABSTRACT

A memory device and an intelligent operation method thereof are provided. The memory device includes a memory array, a signal generating circuit, an environment detecting circuit and an artificial intelligence (AI) circuit. The signal generating circuit is configured to generate an inputting signal. The environment detecting circuit is configured to detect at least one environment information. The AI circuit is connected among the memory array, the signal generating circuit and the environment detecting circuit. The AI circuit at least receives the inputting signal from the signal generating circuit, receives the environment information from the environment detecting circuit, receives a first performance information from the memory array, receives a second performance information from the AI circuit and outputs an ideal signal to the memory array according to the inputting signal, the environment information, the first performance information and the second performance information.

20 Claims, 4 Drawing Sheets

MEMORY DEVICE AND INTELLIGENT OPERATION METHOD THEREOF

TECHNICAL FIELD

The disclosure relates in general to an electric device and an operation method thereof, and more particularly to a memory device and an intelligent operation method thereof.

BACKGROUND

Along with the development of the memory technology, various memories are invented. During the operation of the memory, a control signal may be inputted to the memory for performing some procedures, such as a program procedure, a read procedure or an erase procedure.

However, the performance of the memory is based its current-voltage characteristic curve (I-V curve). The I-V curve of the memory may be changed with the environment. Therefore, the performance of memory in not able to be maintained well.

SUMMARY

The disclosure is directed to a memory device and an intelligent operation method thereof. The memory device can adjust an inputting signal to be an ideal signal through an embedded artificial intelligence (AI) circuit. Even if a current-voltage characteristic curve of a memory array may be affected by the environment or the usage time, the functional performance of the memory array can still be effectively maintained.

According to one embodiment, a memory device is provided. The memory device includes a memory array, a signal generating circuit, an environment detecting circuit and an artificial intelligence (AI) circuit. The signal generating circuit is configured to generate an inputting signal. The environment detecting circuit is configured to detect at least one environment information. The AI circuit is connected among the memory array, the signal generating circuit and the environment detecting circuit. The AI circuit at least receives the inputting signal from the signal generating circuit, receives the environment information from the environment detecting circuit, receives a first performance information from the memory array, receives a second performance information form the AI circuit, and outputs an ideal signal to the memory array according to the inputting signal, the environment information, the first performance information and the second performance information.

According to another embodiment, an intelligent operation method of a memory device is provided. The intelligent operation method of the memory device includes the following steps. An inputting signal is generated. At least one environment information is detected. An ideal signal is obtained according to the inputting signal, the environment information, a first performance information and a second performance information by an artificial intelligence (AI) circuit. The first performance information is obtained from a memory array. The second performance information is feedback from the AI circuit. The ideal signal is inputted to the memory array.

Figure 1:
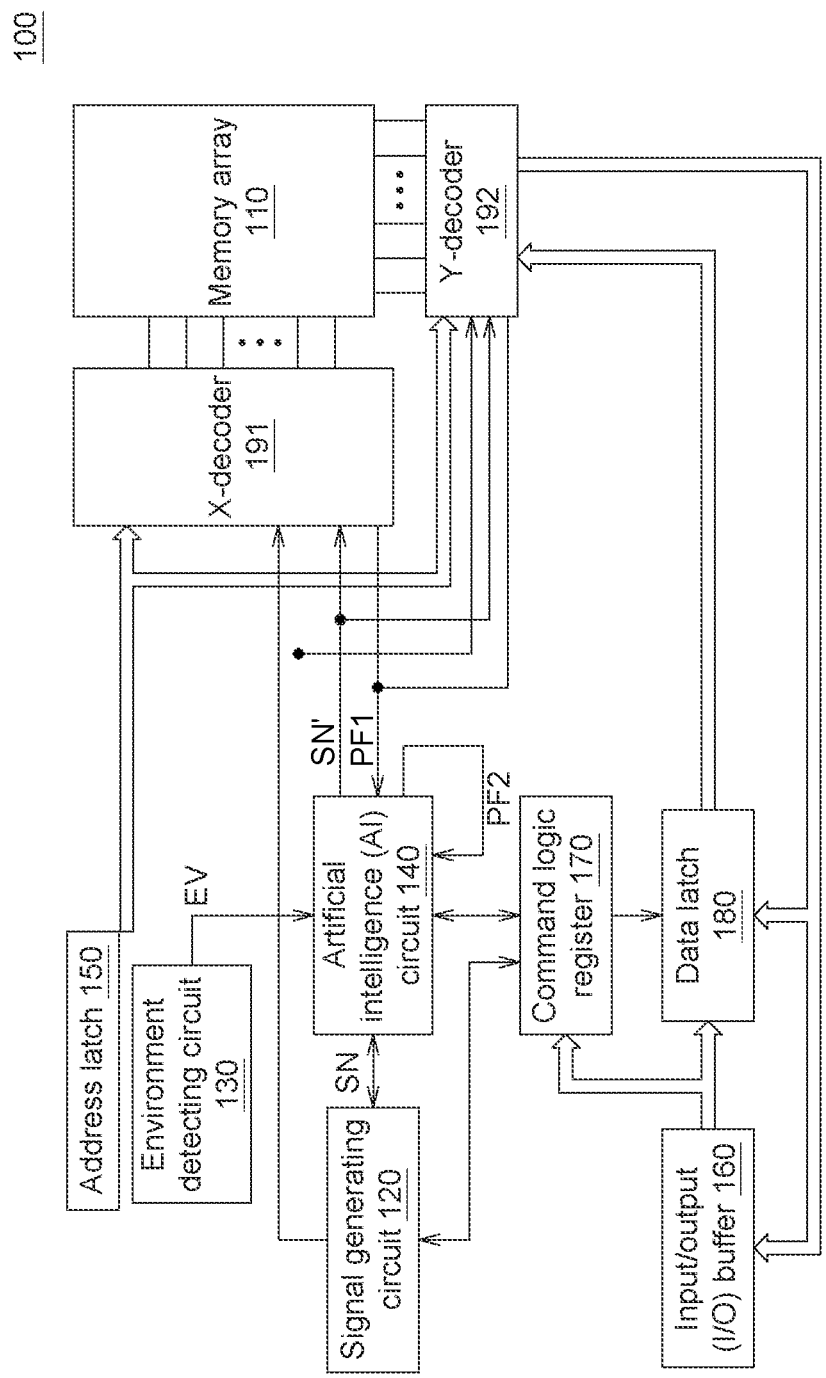
FIG. 1 shows a block diagram of a memory device according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Please refer to FIG. 1, which shows a block diagram of a memory device 100 according to one embodiment. The memory device 100 includes, for example, a memory array 110, a signal generating circuit 120, an environment detecting circuit 130, an artificial intelligence (AI) circuit 140, an address latch 150, an input/output (I/O) buffer 160, a command logic register 170, a data latch 180, a X-decoder 191 and a Y-decoder 192. The memory array 110 is used to store data. For example, the memory array 110 is a flash array. Data could be written into the memory array 110. The data stored in the memory array 110 could be read out. Or, data stored in the memory array 110 could be erased.

The signal generating circuit 120 is used to generate an inputting signal SN, such as a program voltage, a read voltage or an erase voltage. In one embodiment, the inputting signal SN is directly inputted to the memory array 110. However, the current-voltage characteristic curve (I-V curve) of the memory array 110 may be changed due to the environment condition, the usage time, or the manufacturing process. In case of the I-V curve of the memory array 110 is changed, the memory array 110 will not function properly based on the unchanged inputting signal SN. For example, after a period of time, written data may be easily lost; or, some data may not be completely erased.

The environment detecting circuit 130 is used to detect at least one environment information, such as a thermal information, a pressure information or a humidity information, etc. The environment detecting circuit 130 is, for example, a micro-electro-mechanical device, which can detect one or more types of environment information.

The AI circuit 140 is connected among the memory array 110, the signal generating circuit 120 and the environment detecting circuit 130. In this embodiment, the AI circuit 140 at least receives the inputting signal SN from the signal generating circuit 120, receives the environment information EV from the environment detecting circuit 130, receives a first performance information PF1 from the memory array 110, receives a second performance information PF2 from the AI circuit 140, and outputs an ideal signal SN' to the memory array 110 according to the inputting signal SN, the environment information EV and the performance information PF. The first performance information PF1 is, for example, a read cycle, a retention or a leakage current of the memory array 110. The second performance information PF2 is, for example, a voltage, a current or a percentage of the AI circuit 140. Whether the performance information PF is higher or lower than a target is used to adjust the ideal SN'.

Figure 2:
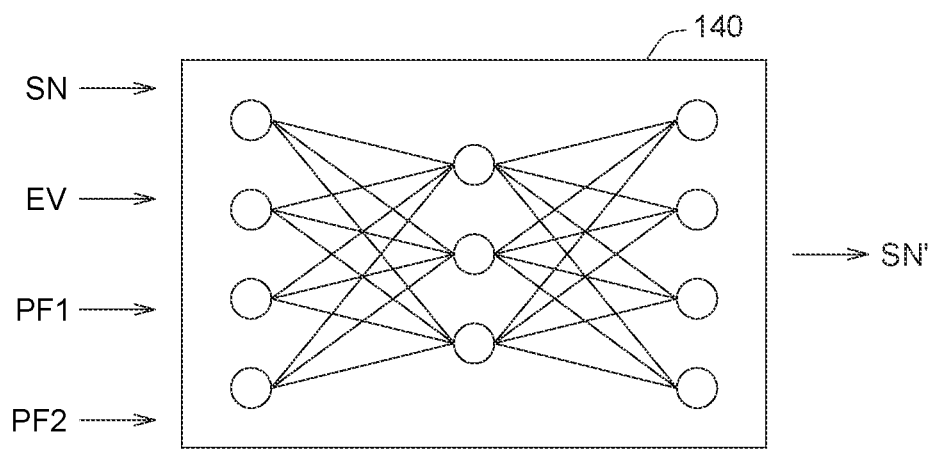
FIG. 2 shows the AI circuit.

Please refer to FIG. 2, which shows the AI circuit 140. The AI circuit 140 is, for example, an Affine Layer circuit, a ReLU circuit, a sigmoid circuit, a neural network (NN) circuit, a Recurrent neural network (RNN) circuit or a Convolutional neural network (CNN) circuit. The AI circuit 140 is trained based on a large amount of training data. After training, the AI circuit 140 is fixedly embedded in the memory device 100. When the AI circuit 140 is executed, the input information includes, for example, the inputting signal SN, the environment information EV, the first performance information PF1 and the second performance information PF2; after calculation, the output information is, for example, the ideal signal SN'. The ideal signal SN' can be provided to the memory array 110 for program, read, erase and other operations.

In one embodiment, the AI circuit 140 may have multiple different modules. Different inputting signals SN, such as the input voltage, the read voltage, the erase voltage, etc., can be processed by different modules to output appropriate ideal signals SN' accordingly.

Figure 3:
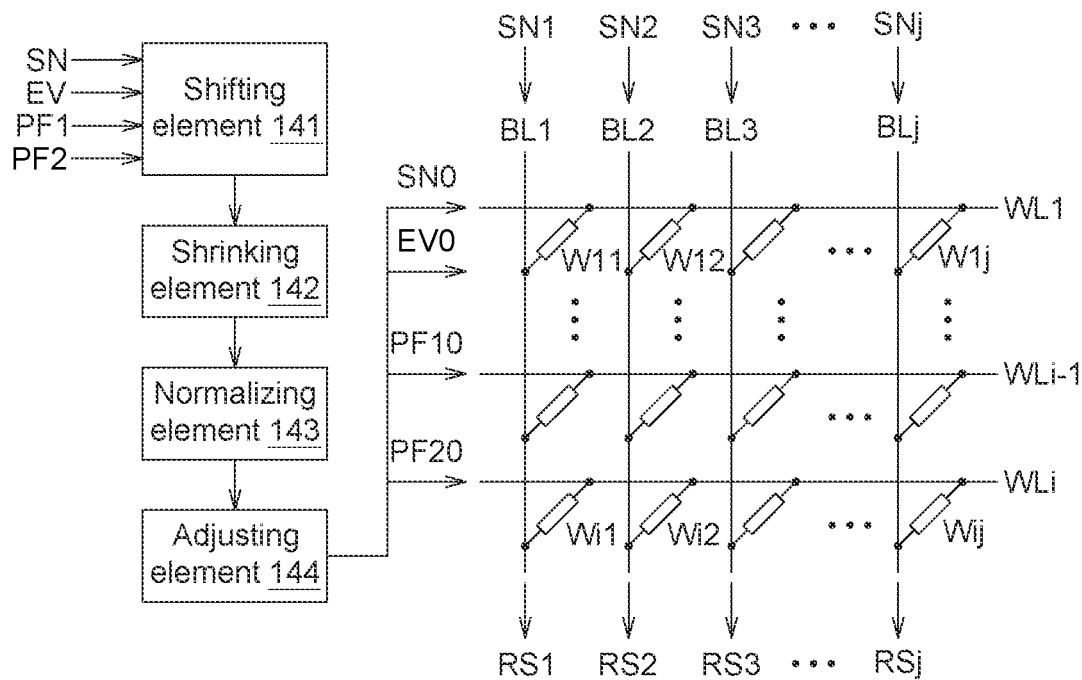
FIG. 3 shows a circuit diagram of the AI circuit according to an embodiment.

Please refer to FIG. 3, which shows a circuit diagram of the AI circuit 140 according to an embodiment. For example, the AI circuit 140 includes a plurality of word lines WL1, ..., WLi−1, WLi, a plurality of bit lines BL1, BL2, BL3, ..., BLj, and a plurality of weighting elements W11, W12, ..., W1j, ..., Wi1, Wi2, ..., Wij. The weighting elements W11, W12, ..., W1j, ..., Wi1, Wi2, ..., Wij, for example, are non-volatile memories, which can store different weight values by modulating the threshold voltage. Alternatively, the weighting elements W11, W12, ..., W1j, ..., Wi1, Wi2, ..., Wij can also be resistive memory, which can store different weight values by adjusting the resistance value. The AI circuit 140 can adopt various architectures, and the present invention is not limited to a specific architecture. For example, the word lines WL1, ..., WLi−1, WLi of the AI circuit 140 can be used to input information, such as the inputting signal SN, the environment information EV, the first performance information PF1 and the second performance information PF2. The bit lines BL1, BL2, BL3, ..., BLj can be used to output predicting result RS1, RS2, RS3, ..., RSj of various modulation signals SN1, SN2, SN3, ..., SNj. The modulation signal with the best predicting result can be used as the ideal signal SN' (shown in FIG. 2).

The above-mentioned AI circuit 140 in FIG. 3 is explained with a single-layer structure as an example. In another embodiment, the AI circuit 140 can also be a multi-layer structure. The present invention is not limited to the example structure in FIG. 3.

The original value of the inputting signal SN mentioned above is, for example, a value of the voltage; the original value of the environment information EV is, for example, a value of the temperature; and the original value of the first performance information PF1 is, for example, a value of the cycle time, a value of the time or a value of the current; the original value of the second performance information PF2 is, for example, a value of the voltage, a value of the current or a value of the percentage. The grade distances and variances of these original values are not the same, so it is difficult to use these original values for prediction and analysis. As shown in FIG. 3, the AI circuit 140 may further include a shifting element 141, a shrinking element 142, a normalizing element 143 and an adjusting element 144.

The shrinking element 142 is used to reduce the values of the inputting signal SN, the environment information EV, the first performance information PF1 and the second performance information PF2. For example, the shrinking element 142 is a logarithmic operation circuit, which uses logarithmic operation to reduce the value.

The shifting element 141 is used to shift the value of the inputting signal SN, the environment information EV and the performance information PF. For example, the shifting element 141, for example, uses a subtractor to perform numerical shifting.

For example, the operations performed by the shifting element 141 and the shrinking element 142 on the circuit are equivalent to the operation of the following equation (1).

$$y = \log(x - |x_{min}| + 1) \quad (1)$$

x represents the original value, y is the calculated value of the equation (1), and $x_{min}$ is the minimum value among all of the original value. In the above equation (1), subtraction is the shifting action, and log is the shrinking action. Subtracting $|x_{min}|$ can improve the situation that there is no value below $x_{min}$. Adding 1 is used to avoid negative values generated by the log operation. $\log(x-|x_{min}|+1)$ completes the above numerical shifting and numerical shrinking.

The normalizing element 143 is used to normalize the values of the inputting signal SN, the environment information EV, the first performance information PF1 and the second performance information PF2 to a predetermined range. The predetermined range is, for example, 0 to 1. For example, the action performed by the normalizing element 143 on the circuit is equivalent to the operation of the following equation (2).

$$y_0 = \frac{(y - y_{min})}{\sqrt{(y_{max} - y_{min})^2 + 10^{-14}}} \quad (2)$$

y is the calculated value of the above equation (1), $y_{min}$ is the minimum value among all of the calculated values of the above equation (1), $y_{max}$ is the maximum value among all of the calculated values of the above equation (1), $y_0$ is the calculated value of the equation (2). The above equation (2) can calculate the percentile of y in its distribution, which is standardized to the range of 0 to 1.

The adjusting element 144 is used to adjust the distribution and position of the inputting signal SN, the environment information EV, the first performance information PF1 and the second performance information PF2. For example, the action performed by the adjusting element 144 on the circuit is equivalent to the operation of the following equation (3).

$$y' = \gamma * y_0 + \beta \quad (3)$$

y' is the calculated value of the equation (3), $\gamma$ is the distribution adjustment coefficient, and B is the position adjustment coefficient. The distribution adjustment coefficient can adjust the shape and the slope of the distribution, and the position adjustment coefficient can adjust the position of all values.

As shown in the FIG. 3, after the above-mentioned numerical adjustment procedure, the inputting signal SN, the environment information EV, the first performance information PF1 and the second performance information PF2 are adjusted to be an inputting signal SN0, an environment information EV0, a first performance information PF10 and a second performance information PF20 respectively.

Figure 4:
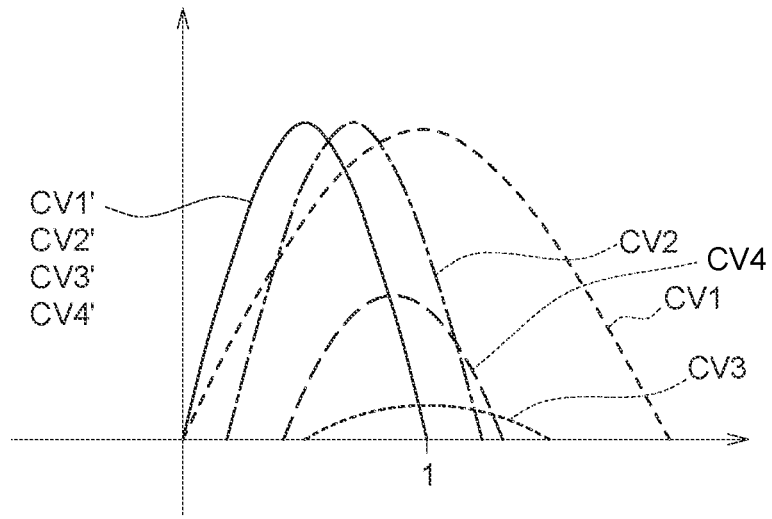
FIG. 4 illustrates the adjustment of numerical values.

Please refer to FIG. 4, which illustrates the adjustment of numerical values. Before the above numerical adjustment procedure, the inputting signal SN has a distribution curve CV1, the environment information EV has a distribution curve CV2, the first performance information PF1 has a distribution curve CV3, and the second performance information PF2 has a distribution curve CV4. After processing by the shifting element 141, the shrinking element 142, the normalizing element 143 and the adjusting element 144, the distribution curves CV1, CV2, CV3, and CV4 are, for example, adjusted to be similar distribution curves CV1', CV2', CV3', and CV4' respectively. In this way, the prediction of the AI circuit 140 will not cause prediction error due to the different grade distances and different variances of the original value.

In addition, the above-mentioned shifting element 141, the shrinking element 142, the normalizing element 143, the adjusting element 144 and the numerical adjustment procedure thereof can also be applied to the pre-training of the AI circuit 140, so that the training data will not have a significant difference in the grade distance and the variances, to obtain the AI circuit 140 with higher accuracy.

Figure 5:
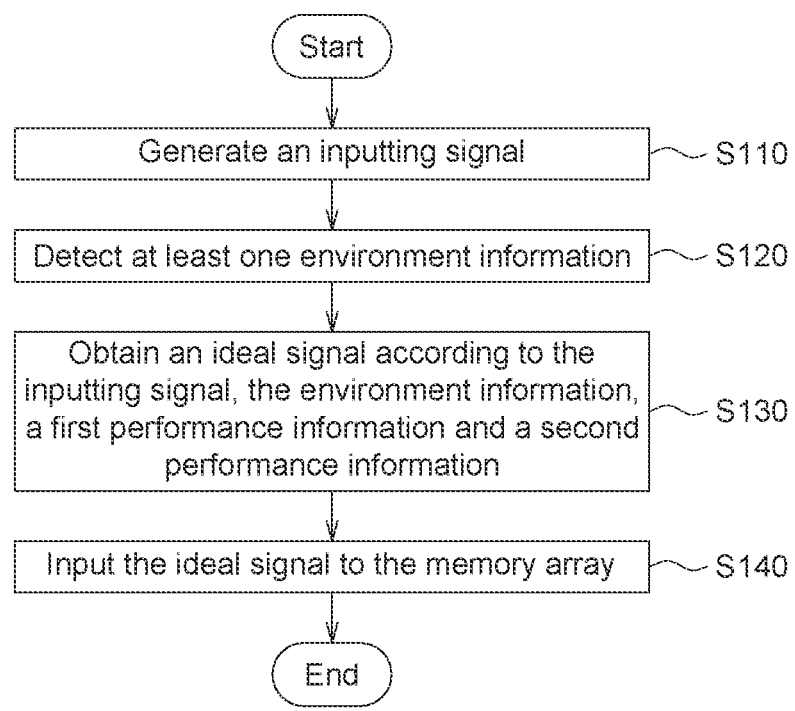
FIG. 5 shows a flow chart of the intelligent operation method of the memory device according to an embodiment.

According to the above description, the memory array 110 of this embodiment does not directly receive the inputting signal SN, but receives the ideal signal SN' outputted by the AI circuit 140. The operation of the memory device 100 is described in detail below with a flow chart. Please refer to FIG. 1 and FIG. 5. FIG. 5 shows a flow chart of the intelligent operation method of the memory device 100 according to an embodiment.

In step S110, the signal generating circuit 120 generates the inputting signal SN. When performing a program procedure, the inputting signal SN is, for example, a program voltage; when performing a read procedure, the inputting signal SN is, for example, a read voltage; when performing a programming and erase procedure, the inputting signal SN is, for example, a programming and erase voltage. The inputting signal SN will be input to AI circuit 140 instead of directly input to memory array 110.

Then, in step S120, the environment detecting circuit 130 detects the environment information EV. The environment detecting circuit 130 can provide the temperature information, the pressure information, or the humidity information and other environment information EV to the AI circuit 140.

Then, in step S130, the artificial intelligence (AI) circuit 140 obtains the ideal signal SN' according to the inputting signal SN, the environment information EV, the first performance information PF1 and the second performance information PF2. In this step, the AI circuit 140 can use machine learning operations to obtain the ideal signal SN' even if the inputting signal SN, the environment information EV, the first performance information PF1 and the second performance information PF2 change. The AI circuit 140 will also perform the above-mentioned numerical adjustment procedure to reduce the prediction error caused by the difference in the original values.

Then, in step S140, the AI circuit 140 inputs the ideal signal SN' to the memory array 110. Under the influence of memory array 110 due to excessive use, temperature, humidity and other factors, even if the current-voltage characteristic curve has changed, the adjusted ideal signal SN' can still properly perform its due function. Under the influence of excessive usage times, temperature, humidity and other factors, even if the current-voltage characteristic curve of the memory array 110 has changed, the memory array 110 receiving the ideal signal SN' can still properly perform its due function.

Figure 6:
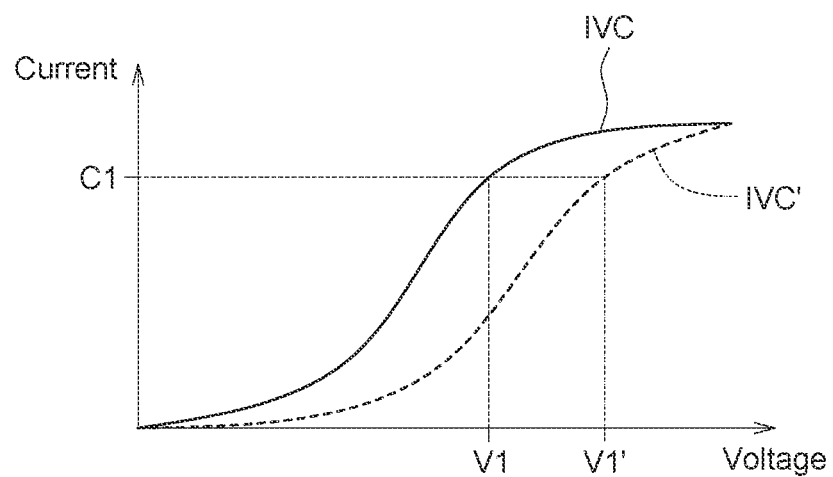
FIG. 6 illustrates different current-voltage characteristic curves.

For example, please refer to FIG. 6, which illustrates different current-voltage characteristic curves IVC, IVC'. Under the current-voltage characteristic curve IVC, the voltage V1 can be inputted to get the corresponding current C1. But after a period of operation, the current-voltage characteristic curve IVC of the memory array 110 may become the current-voltage characteristic curve IVC'. Under current-voltage characteristic curve IVC', the corresponding current C1 cannot be obtained after inputting the voltage V1. In this embodiment, the voltage V1 can be adjusted to a voltage V1' through the AI circuit 140. Under current-voltage characteristic curve IVC', the corresponding current C1 can be obtained after inputting the voltage V1'. Therefore, the memory array 110 can still properly function as it should.

According to the above embodiment, the memory device 100 can adjust the inputting signal SN to be the ideal signal SN' through the embedded AI circuit 140. Even if the current-voltage characteristic curve of the memory array 110 may be affected by the environment or the usage time, the functional performance of the memory array 110 can still be effectively maintained.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device, comprising:
    a memory array;
    a signal generating circuit, configured to generate an inputting signal;
    an environment detecting circuit, configured to detect at least one environment information; and
    an artificial intelligence (AI) circuit, connected among the memory array, the signal generating circuit and the environment detecting circuit, wherein the AI circuit at least receives the inputting signal from the signal generating circuit, receives the environment information from the environment detecting circuit, receives a first performance information from the memory array, receives a second performance information from the AI circuit and outputs an ideal signal to the memory array according to the inputting signal, the environment information, the first performance information and the second performance information.

2. The memory device according to claim 1, wherein the environment information is a thermal information, a pressure information or a humidity information.

3. The memory device according to claim 1, wherein the inputting signal is a program voltage, a read voltage or an erase voltage.

4. The memory device according to claim 1, wherein the AI circuit includes:
    a shrinking element, configured to shrink the inputting signal, the environment information and the performance information.

5. The memory device according to claim 4, wherein the shrinking element is a log operation circuit.

6. The memory device according to claim 1, wherein the AI circuit includes:
    a shifting element, configured to shift the inputting signal, the environment information, the first performance information and the second performance information.

7. The memory device according to claim 1, wherein the AI circuit includes:
a normalizing element, configured to normalize the inputting signal, the environment information, the first performance information and the second performance information to a predetermined range.

8. The memory device according to claim 7, wherein the predetermined range is 0 to 1.

9. The memory device according to claim 1, wherein the AI circuit includes:
an adjusting element, configured to adjust distributions and locations of the environment information, the inputting signal, the first performance information and the second performance information.

10. The memory device according to claim 1, wherein the AI circuit is an Affine Layer circuit, a ReLU circuit, a sigmoid circuit, a neural network (NN) circuit, a Recurrent neural network (RNN) circuit or a Convolutional neural network (CNN) circuit.

11. An intelligent operation method of a memory device, comprising:
generating an inputting signal;
detecting at least one environment information;
obtaining, by an artificial intelligence (AI) circuit, an ideal signal according to the inputting signal, the environment information, a first performance information and a second performance information, wherein the first performance information is obtained from a memory array, and the second performance information is feedback from the AI circuit; and
inputting the ideal signal to the memory array.

12. The intelligent operation method of the memory device according to claim 11, wherein the environment information is a thermal information, a pressure information or a humidity information.

13. The intelligent operation method of the memory device according to claim 11, wherein the inputting signal is a program voltage, a read voltage or an erase voltage.

14. The intelligent operation method of the memory device according to claim 11, wherein in the step of obtaining the ideal signal, the inputting signal, the environment information, the first performance information and the second performance information are shrunk.

15. The intelligent operation method of the memory device according to claim 14, wherein the inputting signal, the environment information, the first performance information and the second performance information are shrunk via a log operation.

16. The intelligent operation method of the memory device according to claim 11, wherein in the step of obtaining the ideal signal, the inputting signal, the environment information, the first performance information and the second performance information are shifted.

17. The intelligent operation method of the memory device according to claim 11, wherein in the step of obtaining the ideal signal, the inputting signal, the environment information, the first performance information and the second performance information are normalized to a predetermined range.

18. The intelligent operation method of the memory device according to claim 17, wherein the predetermined range is 0 to 1.

19. The intelligent operation method of the memory device according to claim 11, wherein in the step of obtaining the ideal signal, distributions and locations of the environment information, the inputting signal, the first performance information and the second performance information are adjusted.

20. The intelligent operation method of the memory device according to claim 11, wherein the ideal signal is obtained by an artificial intelligence (AI) circuit.

* * * * *